(12) United States Patent
LaFevre et al.

(10) Patent No.: US 10,659,089 B2
(45) Date of Patent: May 19, 2020

(54) DIFFERENTIAL DATA TRANSMITTER WITH PRE-EMPHASIS

(71) Applicant: Teledyne Scientific & Imaging, LLC, Thousand Oaks, CA (US)

(72) Inventors: Kyle LaFevre, Ventura, CA (US); Koosang Jung, Simi Valley, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 15/944,457

(22) Filed: Apr. 3, 2018

(65) Prior Publication Data
US 2019/0305807 A1 Oct. 3, 2019

(51) Int. Cl.
*H04B 1/04* (2006.01)
*H01L 27/06* (2006.01)
*H04L 25/02* (2006.01)

(52) U.S. Cl.
CPC ......... *H04B 1/0475* (2013.01); *H04B 1/0483* (2013.01); *H04L 25/028* (2013.01); *H04L 25/0272* (2013.01); *H01L 27/0629* (2013.01)

(58) Field of Classification Search
CPC . H04L 25/0272; H04L 25/028; H04B 1/0475; H04B 1/0483; H01L 27/0629
See application file for complete search history.

(56) References Cited

U.S. PATENT DOCUMENTS

| 6,265,920 B1* | 7/2001 | Gauthier | H04L 25/028 |
| | | | 327/165 |
| 7,683,673 B2 | 3/2010 | Fensore et al. | |
| 2005/0018778 A1* | 1/2005 | Chang | H04L 25/0288 |
| | | | 375/257 |

(Continued)

FOREIGN PATENT DOCUMENTS

| EP | 1911232 | 7/2011 |
| WO | WO2008/065515 | 6/2008 |

OTHER PUBLICATIONS

Y. Jeong et al., "0.37mW/Gb/s low power SLVS transmitter for battery powered applications," 2012 IEEE International Symposium on Circuits and Systems, Seoul, 2012, pp. 1955-1958.

(Continued)

*Primary Examiner* — David B Lugo
(74) *Attorney, Agent, or Firm* — M.J. Ram and Associates

(57) ABSTRACT

A differential data transmitter with pre-emphasis comprises a main driver coupled to receive an input data stream and to produce a main differential output stream which varies with the input stream, circuitry which provides a delayed and inverted version of the input stream, and a first pre-emphasis driver coupled to the output of the circuitry and arranged to produce a pre-emphasis differential output stream which varies with the delayed and inverted input stream. The pre-emphasis differential output stream is coupled to the main differential output stream to produce differential data transmitter output signals. The main and pre-emphasis drivers operate in parallel, with the pre-emphasis driver boosting (Continued)

the output signals when consecutive bits in the input stream change state, and attenuating the output signals when consecutive bits in the input stream do not change state.

14 Claims, 4 Drawing Sheets

(56) References Cited

U.S. PATENT DOCUMENTS

| | | | |
|---|---|---|---|
| 2005/0057280 A1* | 3/2005 | Groen | H04L 25/0282 |
| | | | 326/86 |
| 2007/0285120 A1* | 12/2007 | Venditti | H03K 19/01758 |
| | | | 326/30 |
| 2008/0218292 A1 | 9/2008 | Park et al. | |
| 2009/0179682 A1* | 7/2009 | Khoury | H04L 25/03878 |
| | | | 327/306 |
| 2013/0225067 A1 | 8/2013 | Card et al. | |

OTHER PUBLICATIONS

T. Toyama et al., "A 17.7Mpixel 120fps CMOS Image sensor with 34.8Gb/s readout," 2011 IEEE International Solid-State Circuits Conference, San Francisco, CA 2011, pp. 420-422.

* cited by examiner

DIFFERENTIAL DATA TRANSMITTER WITH PRE-EMPHASIS

BACKGROUND OF THE INVENTION

Field of the Invention

This invention relates generally to differential data transmitters, and more particularly to scalable-low-voltage-signaling (SLVS) data transmitters.

Description of the Related Art

Differential data transmitters are designed to convey differential digital data between a source and a destination. One type of differential data transmitter is known as a scalable-low-voltage-signaling (SLVS) data transmitter, which is designed to facilitate low power differential high speed data signaling over short distances (via "channels"), such as within a cell phone. However, several problems are associated with this signaling scheme. For example, lossy channels attenuate high frequency components of data being output from a high-speed serial data port. The impact of this attenuation increases with the data transfer speed and channel length, thereby imposing limits on channel length and data rate.

Differential data transmitters suffer from frequency dependent attenuation of the transmitted signal, causing inter-symbol interference (ISI) which may result in unacceptably high degradation of the transmission quality and negatively impact the bit error rate (BER). Conventional differential data transmitters have employed current-mode logic (CML) for which techniques exist to partially overcome this signal quality degradation. However, this approach consumes a considerable amount of power compared to SLVS transmitters which lack methods to compensate for this loss in signal quality. In practice, data signals have minimum and maximum voltage levels $V_{min}$ and $V_{max}$, respectively, and a threshold voltage $V_{th}$ that the signals must cross before they are considered to have transitioned. More frequent transitions result in more attenuation, as the transitions may not have time to reach the $V_{min}$ and $V_{max}$ levels. However, fewer transitions allow the data signals to reach the $V_{min}$ and $V_{max}$ levels, but the signals may then be unable to reach threshold voltage $V_{th}$ when a transition is called for. These factors can render a conventional SLVS system unreliable. Performance may be improved with the use of equalization, but this adds cost and complexity to the transmitter.

SUMMARY OF THE INVENTION

A differential data transmitter with pre-emphasis is presented which overcomes many of the problems discussed above.

The present differential data transmitter, suitably a SLVS transmitter, comprises an input node adapted to receive a input stream of serialized data bits, a first main driver coupled to the input node and arranged to produce a main differential output stream which varies with the input stream, circuitry coupled to the input node which provides a delayed and inverted version of the input stream at an output, and a first pre-emphasis driver coupled to the output of the circuitry and arranged to produce a pre-emphasis differential output stream which varies with the delayed and inverted version of the input stream. The pre-emphasis differential output stream is coupled to the main differential output stream to produce differential data transmitter output signals data_P and data_N at a differential data transmitter output node.

The differential data transmitter output signals have associated full signal swings. The first main and first pre-emphasis drivers operate in parallel and are arranged such that the first pre-emphasis driver boosts the differential data transmitter output signals such that they provide full signal swings when consecutive bits in the input stream change state, and to attenuate the differential data transmitter output signals such that they provide signal swings less than the full signal swings when consecutive bits in the input stream do not change state, with the transmitter's output impedance preferably remaining constant regardless of attenuation state.

Employing pre-emphasis to a differential data transmitter as described herein serves to compensate for high-frequency signal loss over a channel, thereby reducing the negative impact on ISI and BER that might otherwise occur without the use of pre-emphasis.

These and other features, aspects, and advantages of the present invention will become better understood with reference to the following drawings, description, and claims.

DETAILED DESCRIPTION OF THE INVENTION

Figure 1:
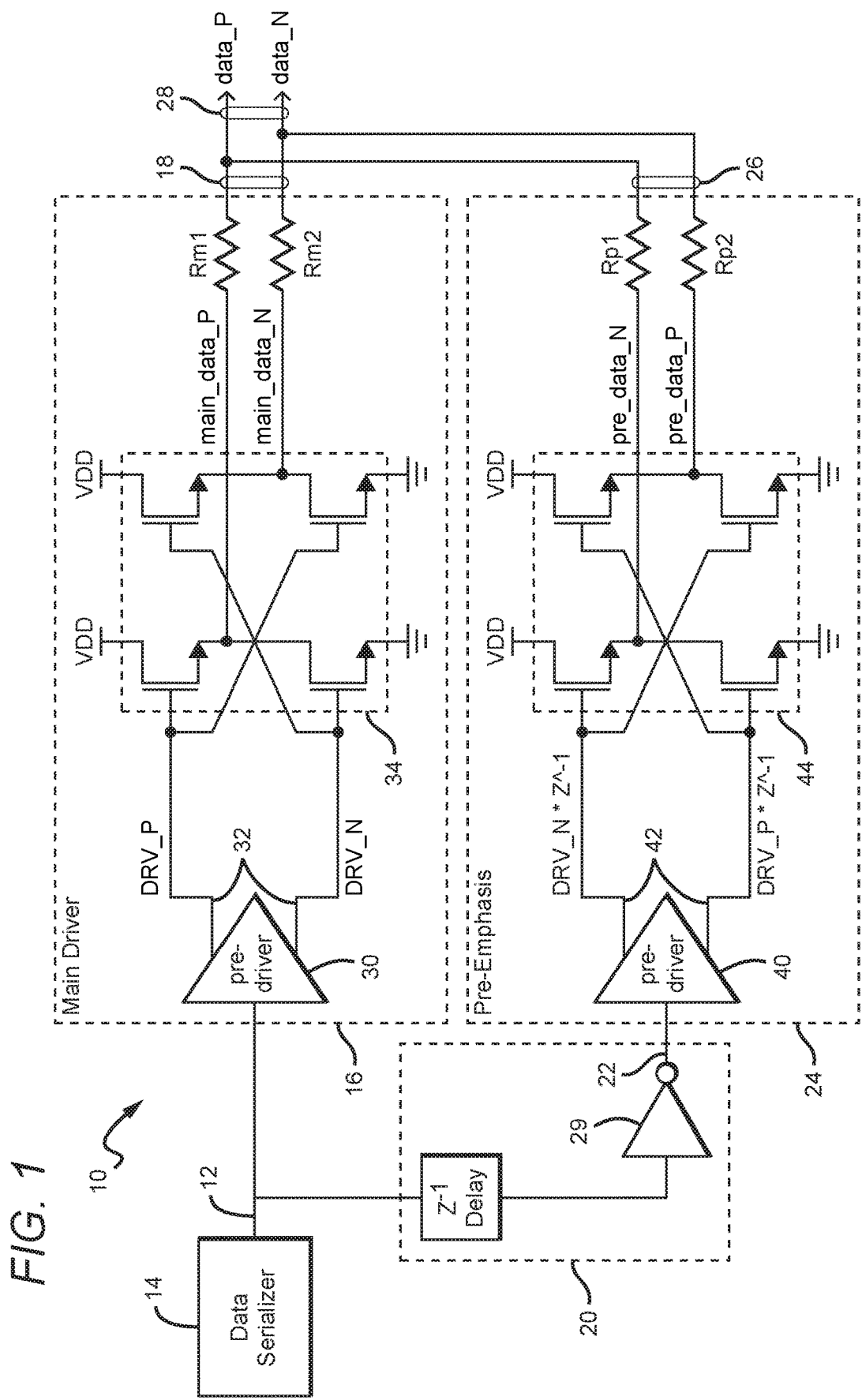
FIG. 1 is a block/schematic diagram of one possible embodiment of a differential data transmitter per the present invention.

A block diagram/schematic illustrating the principles of the present differential data transmitter with pre-emphasis, which is suitably a SLVS transmitter, is shown in FIG. 1. The transmitter 10 comprises an input node 12 adapted to receive an input stream of serialized data bits; the serialized data bits might originate from a data serializer 14, for example. A first main driver 16 is coupled to input node 12 and arranged to produce a main differential output stream 18 which varies with the input stream. Circuitry 20 is coupled to input node 12 and provides a delayed and inverted version of the input stream at an output 22, and a first pre-emphasis driver 24 is coupled to output 22 and arranged to produce a pre-emphasis differential output stream 26 which varies with the delayed and inverted version of the input stream. The pre-emphasis differential output stream 26 is coupled to the main differential output stream 18 to produce differential data transmitter output signals data_P and data_N at a differential data transmitter output node 28.

Differential data transmitter output signals data_N and data_P have associated full signal swings. The first main and first pre-emphasis drivers operate in parallel and are arranged such that the first pre-emphasis driver 24 boosts the differential data transmitter output signals data_P and data_N such that they provide their full signal swings when consecutive bits in the input stream change state, but to attenuate differential data transmitter output signals data_P and data_N such that they provide signal swings less than their full signal swings when consecutive bits in the input stream do not change state. By attenuating data_P and data_N in this way when consecutive bits in the input stream do not change state, ISI is reduced and BER improved in comparison with a differential data transmitter that does not employ pre-emphasis as described herein.

The delayed and inverted input stream is delayed by an amount represented by $Z^{-1}$ and inverted with an inverter 29. One embodiment of first main driver 16 comprises a pre-driver 30 having an input coupled to input node 12, and which provides differential signals DRV_P and DRV_N at a differential output 32. First main driver 16 also comprises first cross-coupled transistors 34 coupled to receive differential signals DRV_P and DRV_N at respective inputs, and to provide differential signals main_data_P and main_data_N at respective outputs. First and second main output resistors $R_{m1}$ and $R_{m2}$ are coupled between main_data_P and main_data_N and the differential data transmitter output node 28.

First pre-emphasis driver 24 is similar, except that the signal polarities are inverted due to inverter 29. One embodiment of first pre-emphasis driver 24 comprises a pre-driver 40 having an input coupled to the delayed and inverted output 22 of circuitry 20, and which provides differential signals DRV_N*$Z^{-1}$ and DRV_P*$Z^{-1}$ at a differential output 42. First pre-emphasis driver 24 also comprises second cross-coupled transistors 44 coupled to receive differential signals DRV_N*$Z^{-1}$ and DRV_P*$Z^{-1}$ at respective inputs, and to provide differential signals pre_data_N and pre_data_P at respective outputs. First and second pre-emphasis output resistors $R_{pt}$ and $R_{p1}$ are coupled between pre_data_N and pre_data_P and differential data transmitter output node 28, such that signal pre_data_N is coupled to output signal data_P, and signal pre_data_P is coupled to output signal data_N.

Figure 2:
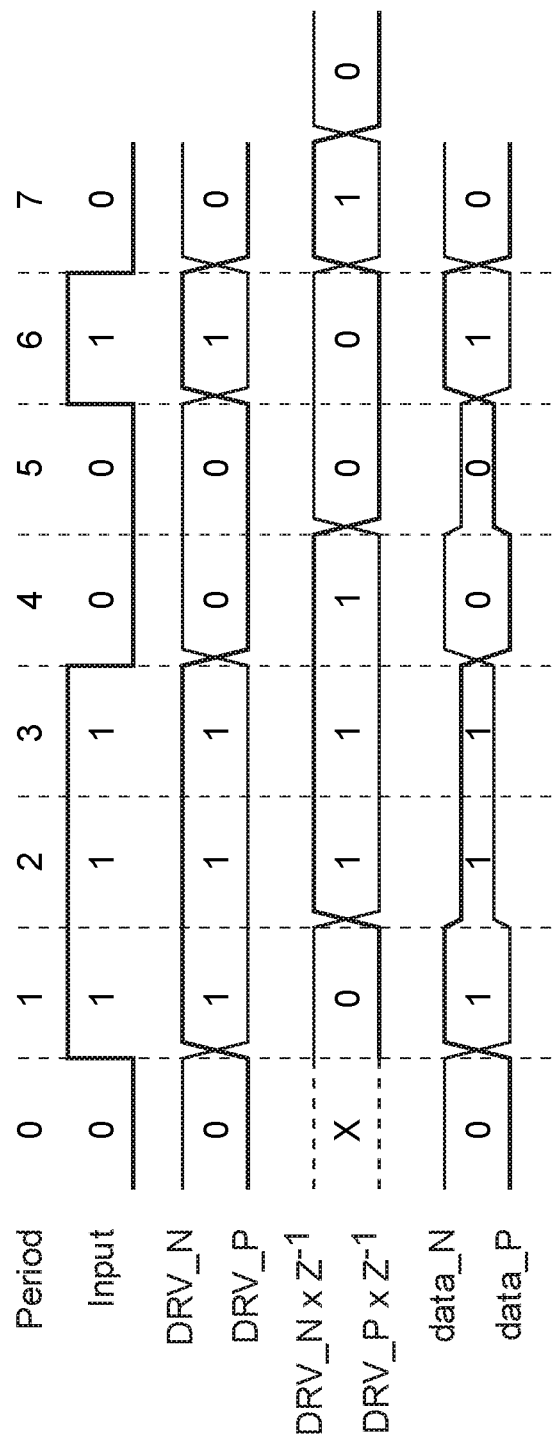
FIG. 2 is a timing diagram illustrating the operation of a differential data transmitter per the present invention.

The operation of a differential data transmitter with pre-emphasis as described herein is illustrated in the timing diagram shown in FIG. 2. The diagram simulates an input stream of serialized data bits (Input), and depicts the states of signals DRV_N, DRV_P, DRV_N*$Z^{-1}$, DRV_P*$Z^{-1}$, data_N and data_P for various input data patterns. Note that signals main_data_P and main_data_N (labeled in FIG. 1) track signals DRV_P and DRV_N, respectively, and signals pre-data_P and pre_data_N track signals DRV_P*$Z^{-1}$ and DRV_N*$Z^{-1}$, respectively.

In period 0, the Input bit is a '0'. This makes DRV_N a '1' and DRV_P a '0', and data_N a '1' and data_P a '0'. The values of DRV_N*$Z^{-1}$ and DRV_P*$Z^{-1}$ depend on what the values of DRV_N and DRV_P, respectively, were in the previous period (which is not shown).

In period 1, the Input bit toggles to a '1'. Thus, consecutive bits in the input stream have changed state. This makes DRV_N change to a '0' and DRV_P change to a '1'. Signals DRV_N*$Z^{-1}$ and DRV_P*$Z^{-1}$ are now known to be equal to the values of DRV_N and DRV_P, respectively, in the previous period; i.e., DRV_N*$Z^{-1}$ is a '1' and DRV_P*$Z^{-1}$ is a '0'. Signals pre_data_N and main_data_P are coupled together and provide output data_P, and signals pre_data_P and main_data_N are coupled together and provide output data_N. Thus, with both DRV_P and DRV_N*$Z^{-1}$ being a '1', and DRV_N and DRV_P*$Z^{-1}$ being a '0', data_P and data_N will exhibit full signal swings when they transition to a '1' and a '0', respectively.

In period 2, the Input bit remains a '1'. As a result, DRV_N and DRV_P remain a '0' and a '1', respectively. However, signals DRV_N*$Z^{-1}$ and DRV_P*$Z^{-1}$ are now equal to the values of DRV_N and DRV_P, respectively, from period 1; i.e., DRV_N*$Z^{-1}$ transitions to a '0' and DRV_P*$Z^{-1}$ becomes a '1'. Now, with DRV_N*$Z^{-1}$ and DRV_P*$Z^{-1}$ being opposite of DRV_N and DRV_P, respectively, differential data transmitter output signals data_P and data_N do not change state, but they are attenuated. By attenuating data_P and data_N when consecutive bits in the input stream do not change state, ISI is reduced and BER improved in comparison with a differential data transmitter that does not employ pre-emphasis as described herein Channel length and/or data transmission speed is also improved when pre-emphasis as described herein is used.

In general, output signal data_N is attenuated when DRV_N and DRV_N*$Z^{-1}$ are substantially equal, and output signal data_P is attenuated when DRV_P and DRV_P*$Z^{-1}$ are substantially equal—which occurs when consecutive Input data bits do not change state. Thus, in FIG. 2, attenuation of data_N and data_P occurs in periods 2, 3, and 5, when DRV_N and DRV_N*$Z^{-1}$ are substantially equal and DRV_P and DRV_P*$Z^{-1}$ are substantially equal. On the other hand, data_N and data_P exhibit full signal swings in periods 1, 4, 6, and 7, each of which occurs right after an Input bit transition.

The level of attenuation is determined by the ratio of the output impedances of the main and pre-emphasis drivers. Assuming that the cross-coupled transistors 34 and 44 comprise FETs (such as NMOS FETs as shown in FIG. 1) which each have an associated 'on' resistance $R_{on}$, and that $R_{m1}=R_{m2}=R_m$ and $R_{p1}=R_{p2}=R_p$, the output impedance of main driver 16 is given by $R_m+R_{on}$ and the output impedance of pre-emphasis driver 24 is $R_p+R_{on}$. Then the combined output impedance $Z_t$ of the differential data transmitter is given by:

$$Z_t = \frac{(R_m + R_{on}) * (R_p + R_{on})}{R_m + R_{on} + R_p + R_{on}}.$$

The differential data transmitter has an associated characteristic impedance $Z_0$, such as 50Ω. Ideally, the differential data transmitter is arranged such that output impedance $Z_t$ matches characteristic impedance $Z_0$. This is desirable because any impedance mismatch between transmitter, channel, and receiver will cause reflections, which interfere with the signal and increase the BER.

Note that the output impedance only depends on the resistance values shown in the equation above. That is, the present differential data transmitter enables pre-emphasis to be applied to the data_N and data_P output signals while maintaining a constant and controlled output impedance.

Figure 3A:
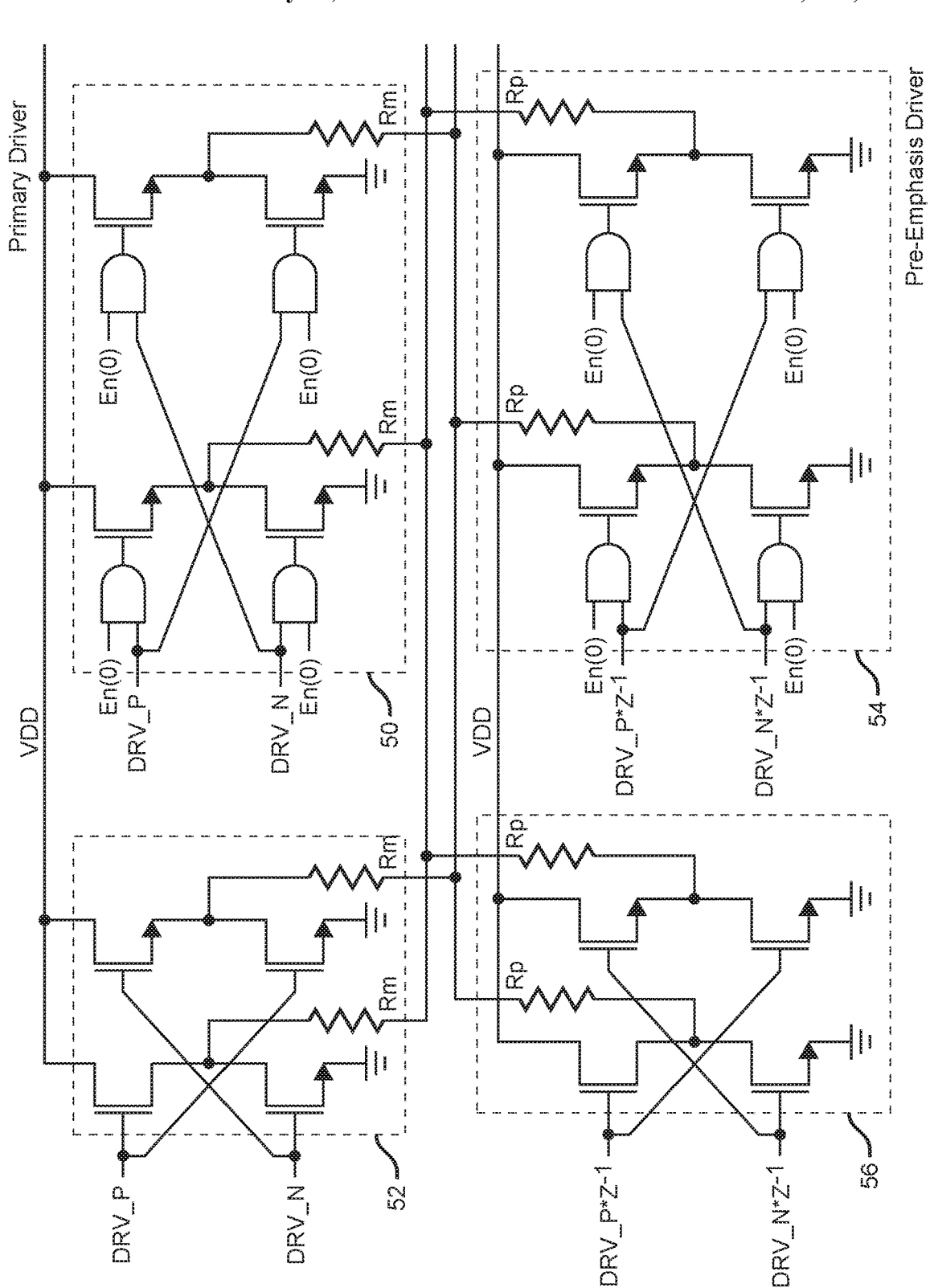
FIGS. 3A and 3B, with FIG. 3B being a continuation of FIG. 3A, are a schematic diagram of one possible embodiment of circuitry with which the output impedance of a differential data transmitter per the present invention can be adjusted.
Figure 3B:
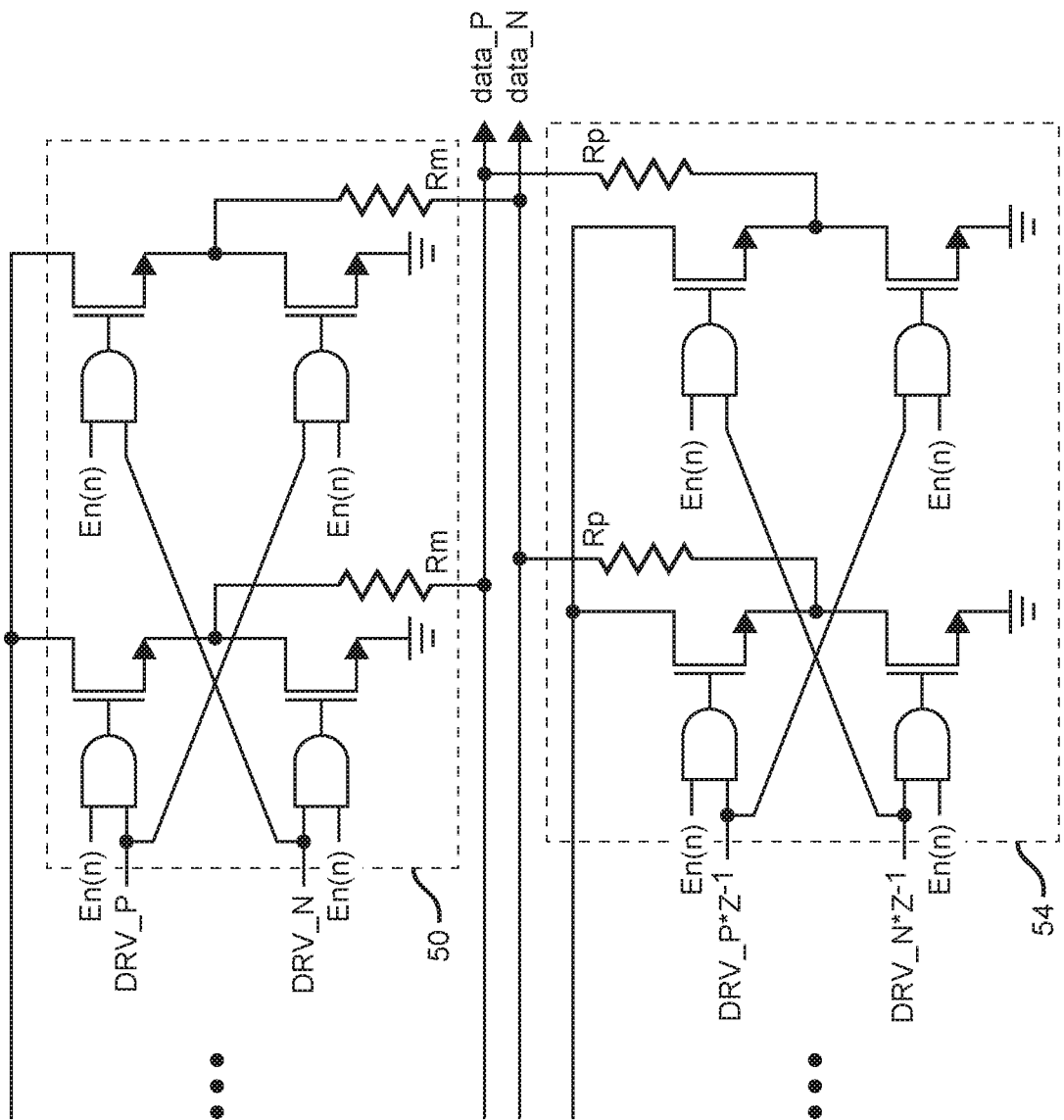

One way in which the output impedance $Z_t$ of the differential data transmitter can be adjusted is illustrated in FIGS. 3A and 3B (note that FIG. 3B is a continuation of FIG. 3A). Here, one or more additional "main" drivers 50 are connected in parallel with a first main driver 52. In addition, or alternatively, one or more "pre-emphasis" drivers 54 are connected in parallel with a first pre-emphasis driver 56. Each additional main driver 52 receives the DRV_P and DRV_N signals output from the pre-driver (not shown) that is part of first main driver 52, and each additional pre-emphasis driver 54 receives the DRV_N*$Z^{-1}$ and DRV_P*$Z^{-1}$ signals output from the pre-driver (not shown) that is part of first pre-emphasis driver 56.

Each of the additional main drivers 50 and/or pre-emphasis drivers 54 is arranged to be enabled or disabled in response to a control signal. There are many ways in which this could be implemented. In the exemplary embodiment shown in FIGS. 3A and 3B, AND gates 60 are employed at the input to each of the cross-coupled transistors, with each AND gate receiving an "enable" control signal (here labeled En(0) . . . En(n)). The enable signals could be operated independently, or in groups, as needed.

When so arranged, the additional drivers could be operated by the control signals to determine the number of additional drivers to connect in parallel, so as to obtain a desired overall output impedance for one or both of the main and pre-emphasis drivers. Typically, the control signals would be operated as needed to make the combined output impedance of the differential data transmitter $Z_t$ match the differential data transmitter's associated characteristic impedance $Z_0$. Being able to adjust the output impedance in this way enables the transmitter to compensate for process variations, and to be used with different channels and different impedance systems.

Another possible use of additional main and/or pre-emphasis drivers connected in parallel as described above is to control the amplitudes of the main and pre-emphasis driver outputs, so as to provide a desired amount of attenuation for the differential data transmitter's output signals data_N and data_P when consecutive bits in the input stream do not change state. This can be accomplished by, for example, controlling the ratio of the number of first and additional main drivers to the number of first and additional pre-emphasis drivers. Attenuation can be increased by decreasing the output impedance of the pre-emphasis driver and increasing the output impedance of the main drivers. Here, the parallel combination can create a constant total output impedance, while adjusting the ratio of the two modifies the attenuation.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A differential data transmitter with pre-emphasis, comprising:
a single-ended input node adapted to receive an input stream of serialized data bits;
a first main driver directly coupled to said input node and arranged to produce a main differential output stream which varies with said input stream;
circuitry coupled to said single-ended input node which provides a delayed and inverted version of said input stream at a single-ended output;
a first pre-emphasis driver directly coupled to the single-ended output of said circuitry and arranged to produce a pre-emphasis differential output stream which varies with said delayed and inverted version of said input stream, said pre-emphasis differential output stream coupled to said main differential output stream to produce differential data transmitter output signals data_P and data_N at a differential data transmitter output node, said differential data transmitter output signals having associated full signal swings;
said first main and first pre-emphasis drivers operating in parallel and arranged such that said first pre-emphasis driver boosts said differential data transmitter output signals such that they provide said full signal swings when consecutive bits in said input stream change state, and to attenuate said differential data transmitter output signals such that they provide signal swings less than said full signal swings when consecutive bits in said input stream do not change state;
wherein said delayed and inverted input stream is delayed by an amount $Z^{-1}$,
said first main driver comprising:
a pre-driver having a single-ended input coupled to said single-ended input node and which provides differential signals DRV_P and DRV_N at a differential output;
first cross-coupled transistors coupled to receive differential signals DRV_P and DRV_N at respective inputs and to provide differential signals main_data_P and main_data_N at respective outputs; and
first and second main output resistors $R_{m1}$ and $R_{m2}$ coupled between said first cross-coupled transistor outputs and said differential data transmitter output node;
said first pre-emphasis driver comprising:
a pre-driver having a single-ended input coupled to the single-ended output of said circuitry and which provides differential signals DRV_N*$Z^{-1}$ and DRV_P*$Z^{-1}$ at a differential output, said first pre-emphasis driver and said circuitry being distinct from each other;
second cross-coupled transistors coupled to receive differential signals DRV_N*$Z^{-1}$ and DRV_P*$Z^{-1}$ at respective inputs and to provide differential signals pre_data_N and pre_data_P at respective outputs; and
first and second pre-emphasis output resistors $R_{p1}$ and $R_{p2}$ coupled between said second cross-coupled transistor outputs and said differential data transmitter output node, such that said signal pre_data_N is coupled to said output signal data_P and said signal pre_data_P is coupled to said output signal data_N;
wherein said differential data transmitter has an associated characteristic impedance $Z_0$ and an output impedance $Z_t$, said differential data transmitter arranged such that said output impedance $Z_t$ matches said characteristic impedance $Z_0$.

2. The differential data transmitter of claim 1, wherein said output signal data_N is attenuated when DRV_N and DRV_N*$Z^{-1}$ are substantially equal, and said output signal data_P is attenuated when DRV_P and DRV_P*$Z^{-1}$ are substantially equal.

3. The differential data transmitter of claim 1, wherein said cross-coupled transistors comprise FETs.

4. The differential data transmitter of claim 3, wherein said FETs comprise NMOS FETs.

5. The differential data transmitter of claim 1, wherein $R_{m1}=R_{m2}=R_m$ and $R_{p1}=R_{p2}=R_p$.

6. The differential data transmitter of claim 1, further comprising a data serializer which provides said input stream of serialized data bits to said single-ended input node.

7. The differential data transmitter of claim 1, wherein said differential data transmitter is a scalable-low-voltage-signaling (SLVS) data transmitter.

8. The differential data transmitter of claim 1, further comprising one or more additional main drivers connected in parallel with said first main driver, each of said additional main drivers arranged to be enabled or disabled in response to a control signal; said differential data transmitter arranged such that $Z_t$ is made to match $Z_0$ solely by controlling the number of additional main drivers enabled or disabled with said control signals.

9. The differential data transmitter of claim 1, further comprising one or more additional pre-emphasis drivers connected in parallel with said first pre-emphasis driver, each of said additional pre-emphasis drivers arranged to be enabled or disabled in response to a control signal; said differential data transmitter arranged such that $Z_t$ is made to match $Z_0$ solely by controlling the number of additional pre-emphasis drivers enabled or disabled with said control signals.

10. The differential data transmitter of claim 1, further comprising one or more additional main drivers connected in parallel with said first main driver, and one or more additional pre-emphasis drivers connected in parallel with said first pre-emphasis driver, each of said additional main and pre-emphasis drivers arranged to be enabled or disabled in response to respective, independent control signals; said differential data transmitter arranged such that $Z_t$ is made to match $Z_0$ solely by controlling the number of additional main drivers and additional pre-emphasis drivers enabled or disabled with said control signals.

11. The differential data transmitter of claim 10, wherein said control signals are operated as needed to obtain a desired output impedance for one or both of said main and pre-emphasis drivers.

12. The differential data transmitter of claim 1, further comprising one or more additional main drivers connected in parallel with said first main driver, and/or one or more additional pre-emphasis drivers connected in parallel with said first pre-emphasis driver, each of said additional main and pre-emphasis drivers arranged to be enabled or disabled in response to respective, independent control signals, the number of said main and pre-emphasis drivers selected to provide a desired amount of attenuation of said differential data transmitter output signals when consecutive bits in said input stream do not change state.

13. A differential data transmitter with pre-emphasis, comprising:
    an input node adapted to receive an input stream of serialized data bits;
    a first main driver coupled to said input node and arranged to produce a main differential output stream which varies with said input stream;
    circuitry coupled to said input node which provides a delayed and inverted version of said input stream at an output;
    a first pre-emphasis driver coupled to the output of said circuitry and arranged to produce a pre-emphasis differential output stream which varies with said delayed and inverted version of said input stream, said pre-emphasis differential output stream coupled to said main differential output stream to produce differential data transmitter output signals data_P and data_N at a differential data transmitter output node, said differential data transmitter output signals having associated full signal swings;
    said first main and first pre-emphasis drivers operating in parallel and arranged such that said first pre-emphasis driver boosts said differential data transmitter output signals such that they provide said full signal swings when consecutive bits in said input stream change state, and to attenuate said differential data transmitter output signals such that they provide signal swings less than said full signal swings when consecutive bits in said input stream do not change state;
    wherein said delayed and inverted input stream is delayed by an amount $Z^{-1}$,
    said first main driver comprising:
        a pre-driver having an input coupled to said input node and which provides differential signals DRV_P and DRV_N at a differential output;
        first cross-coupled transistors coupled to receive differential signals DRV_P and DRV_N at respective inputs and to provide differential signals main_data_P and main_data_N at respective outputs; and
        first and second main output resistors $R_{m1}$ and $R_{m2}$ coupled between said first cross-coupled transistor outputs and said differential data transmitter output node;
    said first pre-emphasis driver comprising:
        a pre-driver having an input coupled to said the output of said circuitry and which provides differential signals DRV_N*$Z^{-1}$ and DRV_P*$Z^{-1}$ at a differential output;
        second cross-coupled transistors coupled to receive differential signals DRV_N*$Z^{-1}$ and DRV_P*$Z^{-1}$ at respective inputs and to provide differential signals pre_data_N and pre_data_P at respective outputs; and
        first and second pre-emphasis output resistors $R_{p1}$ and $R_{p2}$ coupled between said second cross-coupled transistor outputs and said differential data transmitter output node, such that said signal pre_data_N is coupled to said output signal data_P and said signal pre_data_P is coupled to said output signal data_N;
    wherein $R_{m1}=R_{m2}=R_m$ and $R_{p1}=R_{p2}=R_p$;
    wherein said cross-coupled transistors comprise FETs, each of which has an associated 'on' resistance $R_{on}$, such that the output impedance of said main driver is given by $R_m+R_{on}$ and the output impedance of said pre-emphasis driver is given by $R_p+R_{on}$, and such that the combined output impedance $Z_t$ of said differential data transmitter is given by:

$$Z_t = \frac{(R_m + R_{on}) * (R_p + R_{on})}{R_m + R_{on} + R_p + R_{on}}.$$

14. The differential data transmitter of claim 13, wherein said differential data transmitter has an associated characteristic impedance $Z_0$, said differential data transmitter arranged such that said output impedance $Z_t$ matches said characteristic impedance $Z_0$.

* * * * *